United States Patent
Yang

(10) Patent No.: US 11,862,269 B2
(45) Date of Patent: Jan. 2, 2024

(54) TESTING METHOD FOR PACKAGED CHIP, TESTING SYSTEM FOR PACKAGED CHIP, COMPUTER DEVICE AND STORAGE MEDIUM

(71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/615,566

(22) PCT Filed: May 17, 2021

(86) PCT No.: PCT/CN2021/094113
§ 371 (c)(1),
(2) Date: Nov. 30, 2021

(87) PCT Pub. No.: WO2022/012147
PCT Pub. Date: Jan. 20, 2022

(65) Prior Publication Data
US 2023/0187005 A1    Jun. 15, 2023

(30) Foreign Application Priority Data

Jul. 17, 2020 (CN) .......................... 202010689689.9

(51) Int. Cl.
*G11C 29/10* (2006.01)
*G11C 29/12* (2006.01)

(52) U.S. Cl.
CPC ...... *G11C 29/10* (2013.01); *G11C 2029/1206* (2013.01)

(58) Field of Classification Search
None
See application file for complete search history.

(56) References Cited

U.S. PATENT DOCUMENTS

| 6,904,552 B2 | 6/2005 | Cowlers |
| 9,030,904 B2 | 5/2015 | Lee |

(Continued)

FOREIGN PATENT DOCUMENTS

| CN | 102043119 A | 5/2011 |
| CN | 102903395 A | 1/2013 |

(Continued)

OTHER PUBLICATIONS

International Search Report (ISR) in international application No. PCT/CN2021/094113 dated Jul. 29, 2021.

(Continued)

*Primary Examiner* — Cynthia Britt
*Assistant Examiner* — Matthew W Wahlin
(74) *Attorney, Agent, or Firm* — Syncoda LLC; Feng Ma

(57) ABSTRACT

A testing method for a packaged chip includes: acquiring a target chip; in the post-burn-in test process, testing a first data retention time of each memory unit on the target chip; comparing the first data retention time of each memory unit with a preset reference time; and, determining that the target chip is a qualified chip if the first data retention time of each memory unit is not less than the preset reference time. In the present application, by testing the first data retention time of each memory unit on the target chip in the post-burn-in test process, it is determined that the target chip is a qualified chip if the first data retention time of each memory unit is not less than the preset reference time.

7 Claims, 4 Drawing Sheets

(56) References Cited

U.S. PATENT DOCUMENTS

| | | | |
|---|---|---|---|
| 2004/0019838 A1 | 1/2004 | Marr | |
| 2006/0136791 A1 | 6/2006 | Nierle | |
| 2014/0056052 A1 | 2/2014 | Lee | |
| 2014/0195995 A1 | 7/2014 | Bickford et al. | |
| 2014/0198581 A1 | 7/2014 | Kim et al. | |
| 2014/0369144 A1 | 12/2014 | Kim | |
| 2015/0261632 A1* | 9/2015 | Kim .................. | G11C 29/4401 |
| | | | 714/6.11 |
| 2016/0240269 A1 | 8/2016 | Zhou et al. | |
| 2018/0011962 A1 | 1/2018 | Huott et al. | |

FOREIGN PATENT DOCUMENTS

| | | | |
|---|---|---|---|
| CN | 102915764 A | | 2/2013 |
| CN | 102915770 A | | 2/2013 |
| CN | 103366831 A | | 10/2013 |
| CN | 102903395 B | * | 9/2016 |
| CN | 108109668 A | | 6/2018 |
| CN | 108899061 A | | 11/2018 |
| CN | 109524050 A | | 3/2019 |
| CN | 107831391 B | | 6/2019 |
| CN | 110364214 A | | 10/2019 |
| WO | 2014047225 A1 | | 3/2014 |
| WO | 2020048047 A1 | | 3/2020 |

OTHER PUBLICATIONS

CN first office action in Application No. 202010689689.9, dated May 26, 2023.

\* cited by examiner

TESTING METHOD FOR PACKAGED CHIP, TESTING SYSTEM FOR PACKAGED CHIP, COMPUTER DEVICE AND STORAGE MEDIUM

CROSS-REFERENCE TO RELATED APPLICATIONS

This application is a national stage of International Application No. PCT/CN2021/094113 filed on May 17, 2021, which claims priority to Chinese Patent Application No. 202010689689.9, filed on Jul. 17, 2020. The disclosures of the above-referenced applications are hereby incorporated by reference in their entirety.

TECHNICAL FIELD

The present application relates to the field of integrated circuit aging tests, in particular to a testing method for a packaged chip, a testing system for a packaged chip, a computer device and a computer-readable storage medium.

BACKGROUND

Electronic products including chips need to undergo a burn-in (BI) test (i.e., an aging test) after they are produced before leaving the factory, thereby screening electronic products that will fail early in normal use and avoiding delivering these electronic products, that will fail early, to customers. Therefore, the BI test is an essential process for electronic products before leaving the factory.

The finished product test will be carried out after the BI test to screen out unqualified products. For a memory chip, the data retention time of the memory chip will deteriorate to a certain extent after the BI test, so a step of testing the data retention time of the memory chip needs also to be added in the finished product test. Memory chips having a data retention time satisfying the requirements are determined as qualified products; otherwise memory chips are determined as secondary products or failed products. The secondary products or failed products are screened out in the finished product test after several rounds of tests, which is disadvantageous to improve the product yield and reduce the production cost.

SUMMARY

On this basis, it is necessary to provide a testing method for a packaged chip, a testing system for a packaged chip, a computer device and a computer-readable storage medium in view of the above technical problem.

A testing method for a packaged chip is provided, comprising following steps:

acquiring a target chip;

in a post-burn-in test process, testing a first data retention time of each memory unit on the target chip;

comparing the first data retention time of each memory unit with a preset reference time; and determining that the target chip is a qualified chip if the first data retention time of each memory unit is not less than the preset reference time.

In one embodiment, the testing method further comprises: after acquiring the target chip, in a pre-burn-in test process, testing a second data retention time of each memory unit on the target chip;

the method further comprises: after the testing the first data retention time of each memory unit on the target chip, acquiring a deterioration condition of a data retention time of each memory unit according to the first data retention time and the second data retention time.

In one embodiment, the testing method further comprises:

determining that a memory unit is an abnormal memory unit if the first data retention time of the memory unit is less than the preset reference time;

repairing the abnormal memory unit;

testing a third data retention time of the abnormal memory unit; and determining that the target chip is a failed chip if the third data retention time is less than the preset reference time.

In one embodiment, the determining that the memory unit is the abnormal memory unit if the first data retention time is less than the preset reference time comprises:

determining that the target chip is a failed chip if the first data retention time of the memory unit is less than a preset repair time, wherein the preset repair time is less than the preset reference time.

In one embodiment, the repairing the abnormal memory unit comprises:

when the target chip has idle redundant memory units and a number of the idle redundant memory units is not less than a number of abnormal memory units, replacing the abnormal memory unit with a redundant memory unit, the abnormal memory unit being in one-to-one correspondence to the redundant memory unit; and adjusting the third data retention time by using a fuse of the redundant memory unit.

The testing method for a packaged chip comprises following steps: acquiring a target chip; in the post-burn-in test process, testing the first data retention time of each memory unit on the target chip; comparing the first data retention time of each memory unit with the preset reference time; and, determining that the target chip is a qualified chip if the first data retention time of each memory unit is not less than the preset reference time. In the present application, by testing the first data retention time of each memory unit on the target chip in the post-burn-in test process, it is determined that the target chip is a qualified chip if the first data retention time of each memory unit is not less than the preset reference time, and subsequent testing will be performed continuously. In the present application, since the products satisfying the requirements can be screened out in the burn-in test process, compared with the prior art, the test cost is reduced, and the test efficiency is improved.

A testing system for a packaged chip is provided, configured to test a target chip, the system comprising:

a test module, configured to test a data retention time of each memory unit on the target chip;

a control module, connected to the test module and configured to control the test module to test the data retention time of each memory unit in a post-burn-in test process to obtain a first data retention time;

a setup module, configured to set a preset reference time of the memory unit; and a calculation module, connected to the test module, the setup module and the control module, respectively, and configured to compare the first data retention time of each memory unit with the preset reference time and transmit a result of comparison to the control module, the control module being configured to determine that the target chip is a qualified chip if the first data retention time of each memory unit is not less than the preset reference time.

In one embodiment, the control module is further configured to control the test module to test the data retention time of each memory unit in the pre-burn-in test process to obtain a second data retention time; and the calculation module is further configured to compare with the first data retention time with the second data retention time and transmit a result of comparison to the control module, and the control module is configured to acquire a deterioration condition of the data retention time of each memory unit according to the result of comparison.

In one embodiment, the setup module is further configured to set a preset repair time of the memory unit; and the calculation module is further configured to compare the first data retention time with the preset repair time and transmit a result of comparison to the control module, and the control module is further configured to determine that the target chip is a failed chip if the first data retention time of a memory unit is less than the preset repair time;

wherein the preset repair time is less than the preset reference time.

A computer device is provided, comprising a memory and a processor, the memory storing computer programs, the processor implementing the steps in the testing method described above when executing the computer programs.

A computer-readable storage medium is provided, storing computer programs that implement, when executed by a processor, the steps in the testing method described above.

In the testing system for a packaged chip, the computer device and the computer-readable storage medium, by testing the first data retention time of each memory unit on the target chip in the post-burn-in test process, it is determined that the target chip is a qualified chip if the first data retention time of each memory unit is not less than the preset reference time, and subsequent testing will be performed continuously. In the present application, since the products satisfying the requirements can be screened out in the burn-in test process, compared with the prior art, the test cost is reduced, and the test efficiency is improved.

BRIEF DESCRIPTION OF THE DRAWINGS

In order to explain technical solutions of embodiments of the present application or in the prior art more clearly, the drawings to be used for describing the embodiments or the prior art will be introduced simply. Apparently, the drawings to be described below are merely some embodiments of the present application, and a person of ordinary skill in the art may further obtain other drawings according to these drawings without paying any creative effort.

DETAILED DESCRIPTION

Figure 1:
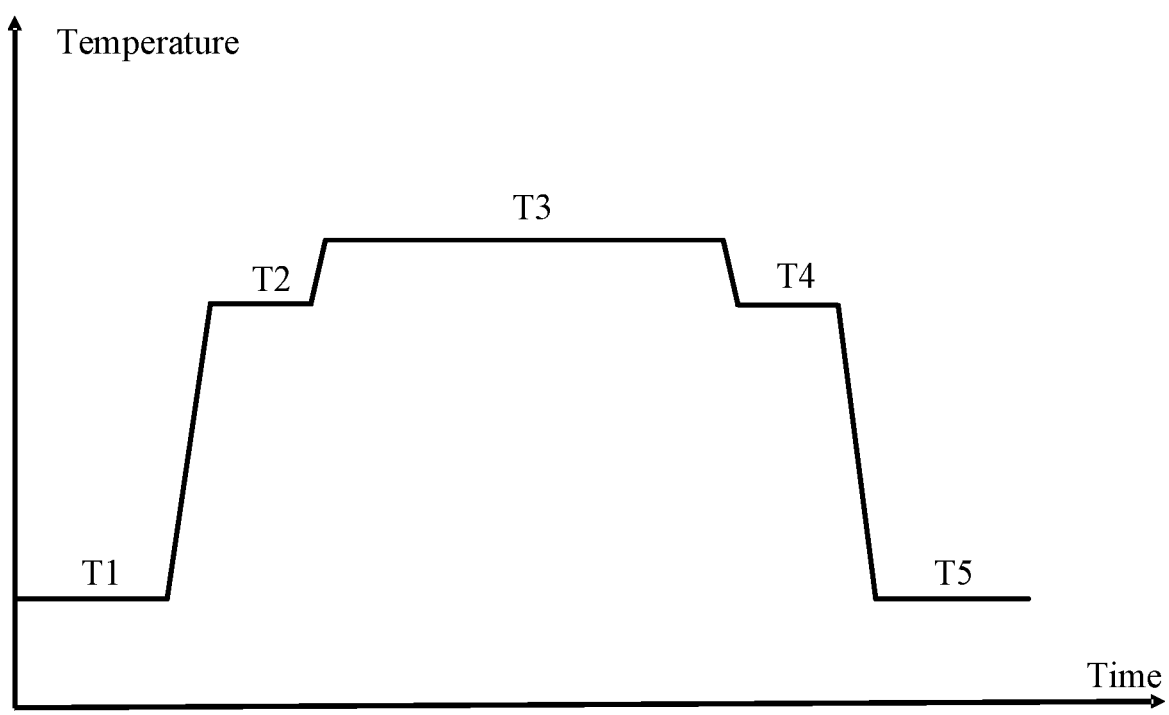
FIG. 1 is an exemplary temperature curve of a BI test of a target chip.

In order to facilitate the understanding of the present application, the present application will be described more fully below with reference to the relevant drawings. The embodiments of the present application are shown in the drawings. However, the present application may be implemented in many different forms and is not limited to the embodiments described herein. On the contrary, these embodiments are provided to make the disclosure of the present application more thorough and comprehensive.

Unless otherwise defined, all technical and scientific terms used herein have the same meanings as those commonly understood by those skilled in the art to which the present application belongs. The terms used in the specification of the present application are only for describing specific embodiments, rather than limiting the present application.

It should be understood that the terms such as "first" and "second" used in the present application can be used herein to describe various elements, but these elements are not limited by these terms. These terms are merely used to distinguish a first element from another element.

It is to be noted that, when one element is regarded as being "connected" to another element, this element may be directly connected to the another element or connected to the another element via an intermediate element. In addition, for the "connection" in the following embodiments, if there are electrical signals or data transmitted between connected objects, it should be interpreted as "electrical connection", "communicative connection" or the like.

As used herein, the singular form "a", "an" and "said/the" may include plural forms, unless the contest clearly indicates otherwise. It should be further understood that the terms "including/comprising" or "having" specify the presence of the stated features, integers, steps, operations, components, parts or combination thereof, but do not exclude the possibility of the presence or addition of one or more other features, integers, steps, operations, components, parts or combinations thereof.

The BI test process of electronic products is specifically described below. After an electronic product is heated to a predetermined temperature, a voltage is applied to the electronic product and the test data is input so that the electronic product operates for a certain time to quicken the aging process. It is observed whether the electronic product fails during the test process. If the electronic product fails, the product is removed and prevented from delivery to customers. As shown in FIG. 1, an exemplary temperature curve of a burn-in test of a target chip is shown. The temperature T1 corresponds to a temperature during the burn-in pretest, and the burn-in pretest is used to determine whether the target chip has functional defects (e.g., poor contact) before the burn-in test. The temperature T2 corresponds to a temperature during the pre-burn-in test, and the pre-burn-in test is used to determine whether the target chip has chip functional defects at the temperature T2. The temperature T3 corresponds to a temperature during the burn-in test, and the manufacturing defects of the target chip can be detected early under the acceleration factors of high temperature and high pressure of the burn-in test. The temperature T4 corresponds to a temperature during the post-burn-in test, and the post-burn-in test is used to determine whether the target chip has functional defects at the temperature T4. The temperature T5 corresponds to a temperature lowered after the burn-in test.

Figure 2:
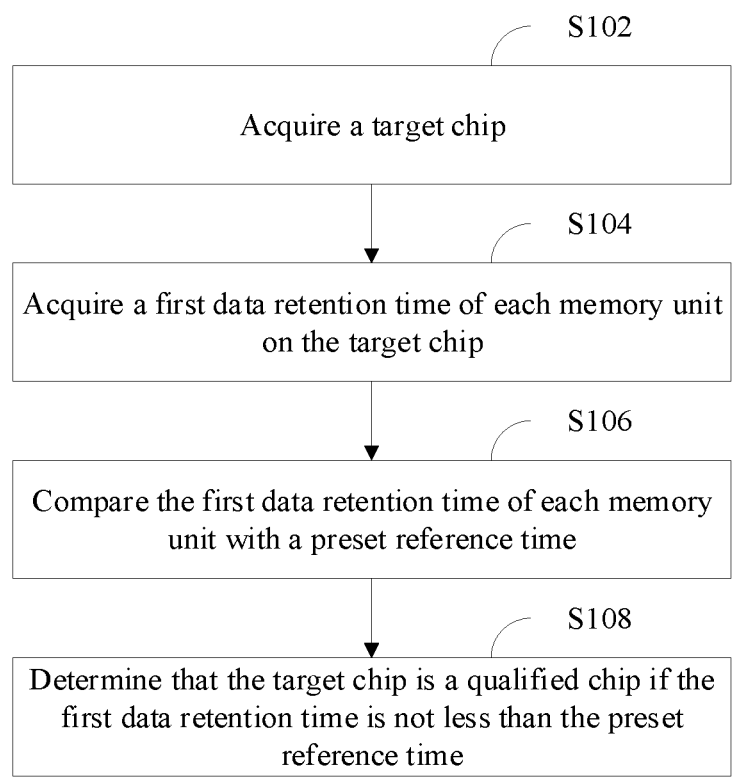
FIG. 2 is a flowchart of a testing method for a packaged chip in an embodiment.

As shown in FIG. 2, in one embodiment, a testing method for a packaged chip is provided, comprising the following steps.

S102: A target chip is acquired.

S104: A first data retention time of each memory unit on the target chip is acquired.

In the post-burn-in test process, a first data retention time of each memory unit on the target chip is tested.

The target chip comprises memory units, and the first data retention time refers to the time when the data stored on the memory units remains unchanged.

S106: The first data retention time of each memory unit is compared with a preset reference time.

The method for testing a data retention time of a memory unit comprises following steps: writing test data into a target memory unit; reading the stored data in the target memory unit after a reference time; comparing the stored data with the test data; if the stored data read from the target memory unit is the same as the test data, indicating that the data retention time of the target memory unit is equal to or greater than the reference time; and, if the stored data read from the target memory unit is not the same as the test data, indicating that the data retention time of the target memory unit is less than the reference time.

The memory units on the target chip are used as a target memory unit, respectively, and the preset reference time is used as a reference time. If the stored data read from a memory unit after the preset reference time is the same as the test data, it is considered that the first data retention time of this memory unit is not less than the preset reference time; or otherwise, it is considered that the first data retention time of this memory unit is less than the preset reference time. By the above method, the relationship between the first data retention time of each memory unit on the target chip and the present reference time can be obtained.

S108: It is determined that the target chip is a qualified chip if the first data retention time of each memory unit is not less than the preset reference time.

The preset reference time means that, when the data retention time of the memory units on the target chip reaches this value, it is considered that the target chip is a qualified product satisfying the requirements. The preset reference time is determined according to the customer's requirements or the JEDC standards. For example, the preset reference time may be 96 ms, 128 ms, etc.

When the first data retention time of each memory unit on the target chip is not less than the preset reference time, it is determined that the target chip is a qualified chip.

In the post-burn-in test process of the target chip, a first data retention time of each memory unit on the target chip is tested, and it is determined according to the first data retention time and the preset reference time whether the target chip is a qualified chip. When the target chip is a qualified chip, subsequent testing will be performed continuously. In this way, the target chip having a data retention time satisfying the requirements can be obtained in the burn-in test process, so that the test efficiency is improved, and the test cost is reduced.

In one embodiment, the testing method further comprises: after acquiring a target chip, in the pre-burn-in test process, testing a second data retention time of each memory unit on the target chip; and the method further comprises: after testing a first data retention time of each memory unit on the target chip, acquiring the deterioration condition of the data retention time of the memory unit according to the first data retention time and the second data retention time.

By comparing the change of the first data retention time in the post-burn-in test process and the second data retention time in the pre-burn-in test process of each memory unit on the target chip, the deterioration condition of the data retention time of each memory unit before and after the burn-in test can be obtained. When the data retention time of the memory unit changes largely, it can be predicted that the process before the burn-in test goes wrong, and it is necessary to check and adjust the process before the burn-in test. Therefore, the process abnormality can be found in time by comparing the data retention time before and after the burn-in test, so that the purpose of reducing the influence of the abnormality on the target chip is achieved.

Figure 3:
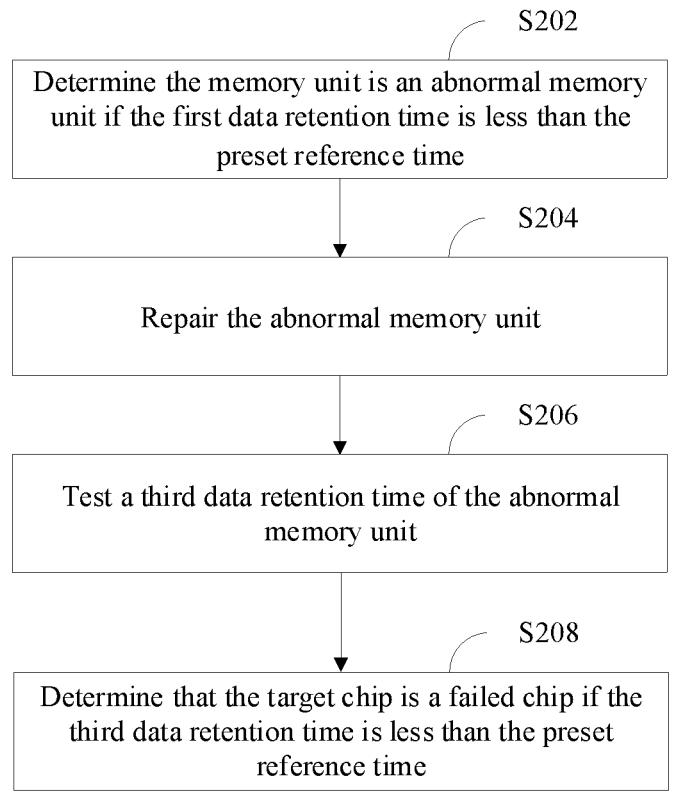
FIG. 3 is a flowchart of a testing method for a packaged chip in another embodiment.

As shown in FIG. 3, in one embodiment, the testing method further comprises the following steps.

S202: It is determined that the memory unit is an abnormal memory unit if the first data retention time is less than the preset reference time.

S204: The abnormal memory unit is repaired.

S206: A third data retention time of the abnormal memory unit is tested.

S208: It is determined that the target chip is a failed chip if the third data retention time of the memory unit is less than the preset reference time.

By repairing memory units having a first data retention time less than the preset reference time, a target chip where the data retention time of the repaired abnormal memory unit is not less than the preset reference time is used as a secondary chip, so that the yield of the target chip is improved and the production cost is reduced.

In one embodiment, the determining that the memory unit is an abnormal memory unit if the first data retention time is less than the preset reference time comprises:

determining that the target chip is a failed chip if the first data retention time of the memory unit is less than a preset repair time, wherein the preset repair time is less than the preset reference time.

The preset repair time means that, when the data retention time of the abnormal memory unit is greater than or equal to the preset repair time, the data retention time of the abnormal memory unit can be repaired as the preset reference time by a redundant memory unit in the target chip; and, when the data retention time of the abnormal memory unit is less than the preset repair time, the data retention time of the abnormal memory unit cannot be repaired as the preset reference time by a redundant memory unit in the target chip.

When the target chip includes an abnormal memory unit and the data retention time of the abnormal memory unit is greater than or equal to the preset repair time and less than the preset reference time, if the data retention time of the abnormal memory unit is repaired as a numerical value greater than or equal to the preset reference time by a redundant memory unit in the target chip, the target chip is a secondary chip; and, if the data retention time of the abnormal memory unit is repaired as a numerical value less than the preset reference time by a redundant memory unit in the target chip, the target chip is a failed chip.

When the first data retention time of memory units in the target chip is less than the preset repair time, it is determined that memory units having abnormal data retention cannot be repaired, and the target chip is a failed chip.

Figure 4:
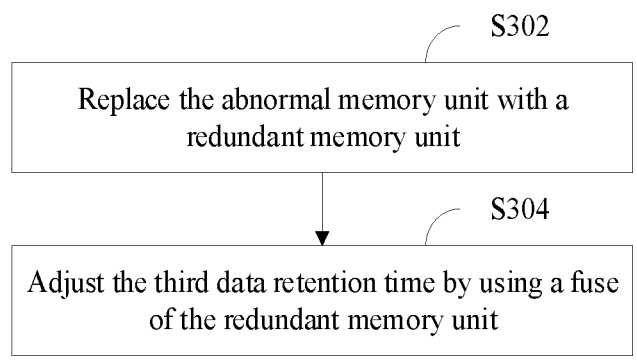
FIG. 4 is a flowchart of a step of repairing the abnormal memory unit in an embodiment.

As shown in FIG. 4, in one embodiment, the repairing the abnormal memory unit comprises the following steps:

S302: The abnormal memory unit is replaced with a redundant memory unit.

When the target chip has idle redundant memory units and the number of the idle redundant memory units is not less than the number of abnormal memory units, replacing the abnormal memory unit with a redundant memory unit, the abnormal memory unit being in one-to-one correspondence to the redundant memory unit.

When the target chip has abnormal memory units having a data retention time less than the preset reference time, whether the target chip has idle redundant memory units and the number of idle redundant memory units are checked. When the number of redundant memory units in the target chip is greater than or equal to the number of abnormal memory units, the abnormal memory units in the target chip are replaced with the redundant memory units. The abnormal memory units are in one-to-one correspondence to the redundant memory units, and the abnormal memory units are replaced with the redundant memory units for data storage.

S304: The third data retention time is adjusted by using a fuse of the redundant memory unit.

After the abnormal memory unit is replaced with a redundant memory unit, the redundant memory unit replacing the abnormal memory unit is used as a new memory unit, the third data retention time of the redundant memory unit is tested in the post-burn-in test process, and the third data retention time is adjusted by a fuse of the redundant memory unit. If the data storage time of the redundant memory unit is not less than the preset reference time, it is determined that the target chip is repaired by the redundant memory unit, and the target chip is a secondary chip; or otherwise, it is determined that the target chip is not repaired, and the target chip is a failed chip.

The testing process of the testing method for a packaged chip will be exemplarily described below. In the pre-burn-in test process, a second data retention time of each memory unit on a target chip is tested, and the position information of each memory unit is recorded; in the post-burn-in test process, a first data retention time of each memory unit on the target chip is tested, and the position information of each memory unit is recorded; and, by comparing the first data retention time and the second data retention time of memory units having the same position information, the deterioration condition of the data retention time of each memory unit can be obtained, so that the manufacturing process is monitored. When the first data retention time of each memory unit is not less than a preset reference time, it is determined that the target chip is a qualified chip; and, when the first data retention time is less than the preset reference time but not less than a preset repair time (the preset repair time is less than the preset reference time), it is determined that memory units having abnormal data retention time on the target chip can be repaired by redundant memory units. If the third data retention time measured during the repair process is not less than the preset reference time, it is determined that the target chip has been repaired as a secondary chip; or otherwise, it is determined that the target chip is a failed chip. When the first data retention time is less than the preset repair time, it is determined that the target chip is a failed chip.

The testing method for a packaged chip comprises following steps: acquiring a target chip; in the post-burn-in test process, testing a first data retention time of each memory unit on the target chip; comparing the first data retention time of each memory unit with a preset reference time; and, determining that the target chip is a qualified chip if the first data retention time of each memory unit is not less than the preset reference time. In the present application, by testing the first data retention time of each memory unit on the target chip in the post-burn-in test process, it is determined that the target chip is a qualified chip if the first data retention time of each memory unit is not less than the preset reference time, and subsequent testing will be performed continuously. In the present application, since the products satisfying the requirements can be screened out in the burn-in test process, compared with the prior art, the test cost is reduced, and the test efficiency is improved.

Figure 5:
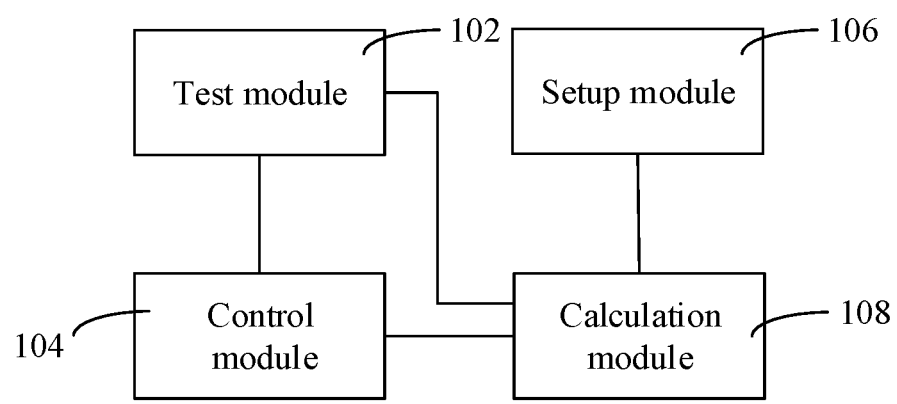
FIG. 5 is a structure block diagram of a testing system for a packaged chip in an embodiment.

As shown in FIG. 5, in one embodiment, a testing system for a packaged chip is provided, configured to test a target chip, the system comprising:

a test module 102, configured to test a data retention time of each memory unit on the target chip;

a control module 104, connected to the test module 102 and configured to control the test module 102 to test the data retention time of each memory unit in the post-burn-in test process to obtain a first data retention time;

a setup module 106, configured to set a preset reference time of the memory unit; and a calculation module 108, connected to the test module 102, the setup module 106 and the control module 104, respectively, and configured to compare the first data retention time of each memory unit with the preset reference time and transmit the result of comparison to the control module 104, the control module 104 being configured to determine that the target chip is a qualified chip if the first data retention time of each memory unit is not less than the preset reference time.

In one embodiment, the control module 104 is further configured to control the test module 102 to test the data retention time of each memory unit in the pre-burn-in test process to obtain a second data retention time; and the calculation module 108 is further configured to compare the first data retention time with the second data retention time and transmit the result of comparison to the control module 104, and the control module 104 is configured to acquire the deterioration condition of the data retention time of the memory unit according to the result of comparison.

In one embodiment, the setup module 106 is further configured to set a preset repair time of the memory unit; and the calculation module is further configured to compare the first data retention time with the preset repair time and transmit the result of comparison to the control module 104, and the control module 104 is further configured to determine that the target chip is a failed chip if the first data retention time is less than the preset repair time;

wherein the preset repair time is less than the preset reference time.

The testing method for a packaged chip provided by the present invention corresponds to the testing method for a packaged chip, and it is hereby declared that the technical features and beneficial effects thereof described in the embodiments of the testing method for a packaged chip are applicable to the embodiments of the testing system for a packaged chip.

In one embodiment, a computer device is provided, comprising a memory and a processor, the memory storing computer programs, the processor implementing the steps in the testing method described above when executing the computer programs.

In one embodiment, a computer-readable storage medium is provided, storing computer programs that implement, when executed by a processor, the steps in the testing method described above.

In the testing system for a packaged chip, the computer device and the computer-readable storage medium, by testing the first data retention time of each memory unit on the target chip in the post-burn-in test process, it is determined that the target chip is a qualified chip if the first data retention time of each memory unit is not less than the preset reference time, and subsequent testing will be performed continuously. In the present application, since the products satisfying the requirements can be screened out in the burn-in test process, compared with the prior art, the test cost is reduced, and the test efficiency is improved.

It should be understood by a person of ordinary skill in the art that all or part of flows in the methods for implementing the above embodiments may be implemented by instructing related hardware using computer programs, and the computer programs may be stored in a nonvolatile computer-readable storage medium and may implement, when executed, the flows of the embodiments of the above methods. Any reference to memories, storages, databases or other mediums used in the embodiments of the present application may comprise at least one of nonvolatile and volatile memories. The nonvolatile memories may comprise read-only memories (ROMs), magnetic tapes, floppy disks, optical memories or the like. The volatile memories may comprise random access memories (RAMs) or external cache memories. By way of illustration and not limitation, the RAMs may be in various forms, for example, static random access memories (SRAMs), dynamic random access memories (DRAMs) or the like.

In the description of this specification, the description referring to the terms "some embodiments", "other embodiments", "ideal embodiments" or the like means that the specific features, structures, materials or characteristics described in conjunction with this embodiment or example are included in at least one embodiment or example of the present invention. In this specification, the schematic description of the above terms does not necessarily refer to the same embodiments or examples.

Various technical features of the above embodiments can be arbitrarily combined. For simplicity, not all possible combinations of various technical features of the above embodiments are described. However, all those technical features shall be included in the protection scope of the present invention if not conflicted.

The above embodiments merely show several implementations of the present application. The description of these embodiments is specific and detailed relatively, but cannot be interpreted as limiting the patent scope of the present invention. It should be noted that, for a person of ordinary skill in the art, several variations and improvements can be made without departing from the concept of the present application, and all the variations and improvements shall fall into the protection scope of the present application. Therefore, the protection scope of the present application should be subject to the appended claims.

What is claimed is:

1. A testing method for a packaged chip, comprising:
acquiring a target chip;
in a post-burn-in test process, testing a first data retention time of each memory unit on the target chip;
comparing the first data retention time of each memory unit with a preset reference time;
determining that the target chip is a qualified chip if the first data retention time of each memory unit is not less than the preset reference time;
determining that a memory unit is an abnormal memory unit if the first data retention time of the memory unit is less than the preset reference time;
repairing the abnormal memory unit;
testing a third data retention time of the abnormal memory unit; and
determining that the target chip is a failed chip if the third data retention time is less than the preset reference time; wherein
the determining that a memory unit is an abnormal memory unit if the first data retention time of the memory unit is less than the preset reference time comprises:
determining that the target chip is a failed chip if the first data retention time of the memory unit is less than a preset repair time,
wherein the preset repair time is less than the preset reference time.

2. The testing method according to claim 1, after the acquiring a target chip, the testing method further comprises:
in a pre-burn-in test process, testing a second data retention time of each memory unit on the target chip; and
after the testing a first data retention time of each memory unit on the target chip, the testing method further comprises:
acquiring a deterioration condition of a data retention time of each memory unit according to the first data retention time and the second data retention time.

3. The testing method according to claim 1, wherein the repairing the abnormal memory unit comprises:
when the target chip has idle redundant memory units and a number of the idle redundant memory units is not less than a number of abnormal memory units, replacing the abnormal memory unit with a redundant memory unit, the abnormal memory unit being in one-to-one correspondence to the redundant memory unit; and
adjusting the third data retention time by using a fuse of the redundant memory unit.

4. A non-transitory computer-readable storage medium storing computer programs that implement, when executed by a processor, the steps in the testing method according to claim 1.

5. A computer device, comprising a memory and a processor, the memory storing computer programs; wherein when executing the computer programs, the processor implements:
acquiring a target chip;
in a post-burn-in test process, testing a first data retention time of each memory unit on the target chip;
comparing the first data retention time of each memory unit with a preset reference time;
determining that the target chip is a qualified chip if the first data retention time of each memory unit is not less than the preset reference time;
determining that a memory unit is an abnormal memory unit if the first data retention time of the memory unit is less than the preset reference time;
repairing the abnormal memory unit;
testing a third data retention time of the abnormal memory unit; and
determining that the target chip is a failed chip if the third data retention time is less than the preset reference time; wherein
the determining that a memory unit is an abnormal memory unit if the first data retention time of the memory unit is less than the preset reference time comprises:
determining that the target chip is a failed chip if the first data retention time of the memory unit is less than a preset repair time,
wherein the preset repair time is less than the preset reference time.

6. The computer device according to claim 5, wherein after the acquiring a target chip, the processor further implements:

in a pre-burn-in test process, testing a second data retention time of each memory unit on the target chip; and after the testing a first data retention time of each memory unit on the target chip, the processor further implements:

acquiring a deterioration condition of a data retention time of each memory unit according to the first data retention time and the second data retention time.

7. The computer device according to claim 5, wherein the repairing the abnormal memory unit comprises:

when the target chip has idle redundant memory units and a number of the idle redundant memory units is not less than a number of abnormal memory units, replacing the abnormal memory unit with a redundant memory unit, the abnormal memory unit being in one-to-one correspondence to the redundant memory unit; and adjusting the third data retention time by using a fuse of the redundant memory unit.

* * * * *